United States Patent
Boisvert et al.

(10) Patent No.: US 7,598,582 B2
(45) Date of Patent: Oct. 6, 2009

(54) ULTRA LOW DARK CURRENT PIN PHOTODETECTOR

(75) Inventors: Joseph Charles Boisvert, Thousand Oaks, CA (US); Takahiro D. Isshiki, Pasadena, CA (US); Rengarajan Sudharsanan, Stevenson Ranch, CA (US)

(73) Assignee: The Boeing Company, Chicago, IL (US)

( * ) Notice: Subject to any disclaimer, the term of this patent is extended or adjusted under 35 U.S.C. 154(b) by 107 days.

(21) Appl. No.: 11/762,489

(22) Filed: Jun. 13, 2007

(65) Prior Publication Data

US 2008/0308891 A1    Dec. 18, 2008

(51) Int. Cl.
*H01L 29/78* (2006.01)
*H01L 31/058* (2006.01)

(52) U.S. Cl. .............. 257/436; 257/432; 257/433; 257/460

(58) Field of Classification Search .......... 257/436, 257/432, 433, 460
See application file for complete search history.

(56) References Cited

U.S. PATENT DOCUMENTS

| 4,990,989 | A  | * | 2/1991  | ElHamamsy et al. | 257/459 |
| 6,573,581 | B1 | * | 6/2003  | Sugg et al.      | 257/451 |
| 7,288,825 | B2 | * | 10/2007 | Rafferty et al.  | 257/436 |

* cited by examiner

*Primary Examiner*—Marcos D. Pizarro
*Assistant Examiner*—Steven H Rao
(74) *Attorney, Agent, or Firm*—Yee & Associates, P.C.; Brett L. Halperin

(57) ABSTRACT

A photodetector and a method for fabricating a photodetector. The photodetector may include a substrate, a buffer layer formed on the substrate, and an absorption layer formed on the buffer layer for receiving incident photons and generating charged carriers. An N-doped interface layer may be formed on the absorption layer, an N-doped cap layer may be formed on the N-doped interface layer, and a dielectric passivation layer may be formed above the cap layer. A $P^+$ diffusion region may be formed within the cap layer, the N-doped interface layer and at least a portion of the absorption layer, and at least one contact may be formed on and coupled to the $P^+$ diffusion region.

19 Claims, 4 Drawing Sheets

ULTRA LOW DARK CURRENT PIN PHOTODETECTOR

This invention was made with U.S. Government support under Contract No. S.O. #8868 awarded by Defense Advanced Research Projects Agency. The Government has certain rights in this invention.

BACKGROUND INFORMATION

1. Field

The disclosure relates generally to a photodetector and method and, more particularly, to a photodetector having ultra low dark current and a method for fabricating a photodetector having ultra low dark current.

2. Background

Dark current is a current that flows in a photodetector when it is not receiving any light, and is a significant source of noise in PIN photodetectors having high sensitivity. Current efforts to reduce dark current in PIN photodetectors focus primarily on reducing diffusion currents in the photodetector (the process of carriers distributing themselves from regions of high concentration to regions of low concentration) which is a significant contributor to dark current.

One known approach to reducing diffusion current is to uniformly dope the "intrinsic absorption" layer of the photodetector (see, for example, U.S. Pat. No. 6,573,581). Although this approach does reduce diffusion current, it fails to address generation current due to defects in the photodetector material or at a surface, which is also a major contributor to and actually dominates the total dark current in small pixels used for imaging arrays at or below room temperature.

There is, accordingly, a need for a photodetector that has very low dark current and to a method for fabricating a photodetector having a very low dark current.

SUMMARY

An embodiment of the disclosure provides a photodetector. The photodetector may include a substrate, a buffer layer formed on the substrate, and an absorption layer formed on the buffer layer for receiving incident photons and generating charged carriers. An N-doped interface layer may be formed on the absorption layer, a cap layer may be formed on the N-doped interface layer, and a dielectric passivation layer may be formed above the cap layer. A $P^+$ diffusion region may be formed within the cap layer, the N-doped interface layer and at least a portion of the absorption layer, and at least one contact may be formed on and coupled to the $P^+$ diffusion region.

A further embodiment of the disclosure provides a method for fabricating a photodetector. The method may include forming a substrate, forming a buffer layer on the substrate, and forming an absorption layer on the buffer layer for converting incident photons to electrons and holes. An N-doped interface layer may be formed on the absorption layer, a cap layer may be formed on the N-doped interface layer, and a dielectric passivation layer may be formed above the cap layer. A $P^+$ diffusion region may be formed within the cap layer, the N-doped interface layer and at least a portion of the absorption layer, and at least one contact may be formed on and coupled to the $P^+$ diffusion region.

A further embodiment of the disclosure provides a PIN photodetector. The PIN photodetector may include an $N^+$ InP substrate, an $N^+$ InP buffer layer formed on the substrate, and an intrinsic InGaAs absorption layer formed on the buffer layer for receiving incident photons and generating charged carriers. An N-doped interface layer may be formed on the absorption layer and a cap layer may be formed on the N-doped interface layer, wherein the N-doped interface layer reduces depletion width at an interface between the intrinsic InGaAs absorption layer and the cap layer. A dielectric passivation layer may be formed above the cap layer, and a $P^+$ Zn diffusion region may be formed within the cap layer, the N-doped interface layer and at least a portion of the absorption layer. At least one metal contact may be formed on and coupled to the $P^+$ Zn diffusion region.

The features, functions, and advantages can be achieved independently in various embodiments or may be combined in yet other embodiments.

BRIEF DESCRIPTION OF THE DRAWINGS

The novel features believed characteristic of the embodiments are set forth in the appended claims. The embodiments themselves, however, as well as a preferred mode of use, further objectives and advantages thereof, will best be understood by reference to the following detailed description of advantageous embodiments when read in conjunction with the accompanying drawings, wherein:

DETAILED DESCRIPTION

Figure 1:
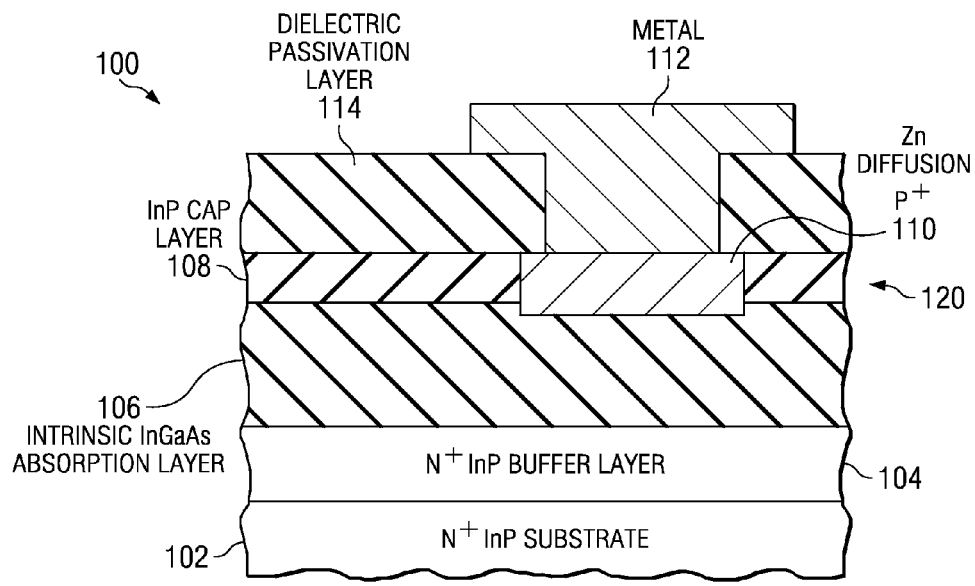
FIG. 1 is an illustration of a photodetector that is known in the art to assist in explaining advantageous embodiments of the disclosure.

With reference now to the figures, and, in particular, with reference to FIG. 1, an illustration of a photodetector that is known in the art is depicted to assist in explaining advantageous embodiments of the disclosure. More particularly, FIG. 1 illustrates a PIN photodetector 100 that was designed to reduce dark current in the photodetector by reducing diffusion current, which is known to be a significant source of dark current in PIN photodetectors. PIN photodetector 100 generally includes $N^+$ InP substrate 102, $N^+$ InP buffer layer 104 formed on substrate 102, intrinsic InGaAs absorption layer 106 formed on buffer layer 104, InP cap layer 108 formed on absorption layer 106, $P^+$ Zn diffusion region 110 formed in cap layer 108 and extending into absorption layer 106, and metal contacts 112 formed on and coupled to diffusion region 110. A dielectric passivation layer 114 is formed above the cap layer 108.

PIN photodetector 100 is fabricated in the following manner. Substrate 102 is an $N^+$ InP substrate typically doped with sulfur between $1\times10^{18}$-$5\times10^{18}/cm^3$, and buffer layer 104 is an $N^+$ InP layer of about the same doping concentration as substrate 102. Buffer layer 104 is grown on substrate 102 to a thickness of about 0.5-1.0 µm. Either sulfur or silicon may be used as the dopant species for the substrate and buffer layer. A Metal Organic Vapor Phase Epitaxy (MOVPE) reactor or Molecular Beam Epitaxy (MBE) reactor may be used to grow the buffer layer and all subsequent semiconductor layers of PIN photodetector 100.

Intrinsic InGaAs absorption layer 106 is then grown on top of buffer layer 104. Absorption layer 106 comprises an unintentionally-doped $In_{0.53}Ga_{0.47}As$ semiconductor layer grown to a thickness of about 3.5 µm on top of buffer layer 104. Intrinsic InGaAs absorption layer 106 functions to convert photons to electrons and holes through the photoelectric effect. The InGaAs absorption layer alloy composition is typically chosen to provide a layer that is lattice-matched to InP.

InP cap layer 108 is then grown over intrinsic InGaAs absorption layer 106. Cap layer 108 is grown to a thickness of about 0.5-1.0 µm, and can be unintentionally doped or doped to about $1 \times 10^{16}/cm^3$ using either sulfur or silicon as the dopant species. Cap layer 108 is used to provide a wide bandgap semiconductor over narrow bandgap absorption layer 106 in order to reduce surface generation current.

Although not illustrated in FIG. 1, an optional contact layer of heavily doped $In_{0.53}Ga_{0.47}As$ may then be grown over InP cap layer 108 if desired, to provide a low electrical resistance to a subsequently applied metal layer.

A dielectric passivation layer 114 is formed above cap layer 108 (either on the cap layer or on the contact layer if the contact layer is provided). The dielectric passivation layer can be any wide bandgap insulator or semiconductor that serves to terminate the cap layer atomic surface and minimize generation current at that surface. Typical materials used for this purpose are silicon nitride (the preferred material), silicon dioxide or polyimide. Silicon nitride and silicon dioxide can be deposited using low temperature techniques that are well known. Polyimide or other organic films are applied using photolithographic processing techniques and cured using a specific elevated temperature exposure. All of these techniques typically involve temperature excursions to less than 400° C. which is desirable to maintain the rest of the device.

After growth of the epitaxial layers as described above, P+ Zn diffusion region 110 is formed. In particular, a thin (approximately 1000 Å-2000 Å) layer of silicon nitride is deposited on cap layer 108 using plasma enhanced chemical vapor deposition. The layer is then patterned using photolithographic techniques in conjunction with either reactive ion etching or wet chemical etching to form openings in the silicon nitride.

The photodetector structure is then put back into the MOVPE or MBE reactor and exposed to di-methyl zinc which provides a diffusion source of the P-type zinc dopant to the semiconductor surface in those areas where the silicon nitride has been etched away. The exposure time and temperature are controlled to insure that the zinc diffuses through InP cap layer 108 and extends a small distance (for example, about 1000 Å-1500 Å) into the underlying absorption layer 106.

After formation of Zn diffusion region 110, metal contacts 112 are formed on region 110 using photolithographic techniques. Light can be incident from either the metal (contact) side or the substrate side of the photodetector, and an anti-reflection coating may be applied to either side to enhance optical sensitivity, depending on the particular application in which the photodetector is to be used.

Although the design of PIN photodetector 100 is effective in reducing dark current in the photodetector, it has been found that intrinsic InGaAs absorption layer 106 and InP cap layer 108 provide a wide depletion width at interface 120 between the layers, and this wide depletion width has been found to be a significant source of dark current that reduces the effectiveness of the overall photodetector design.

Figure 2:
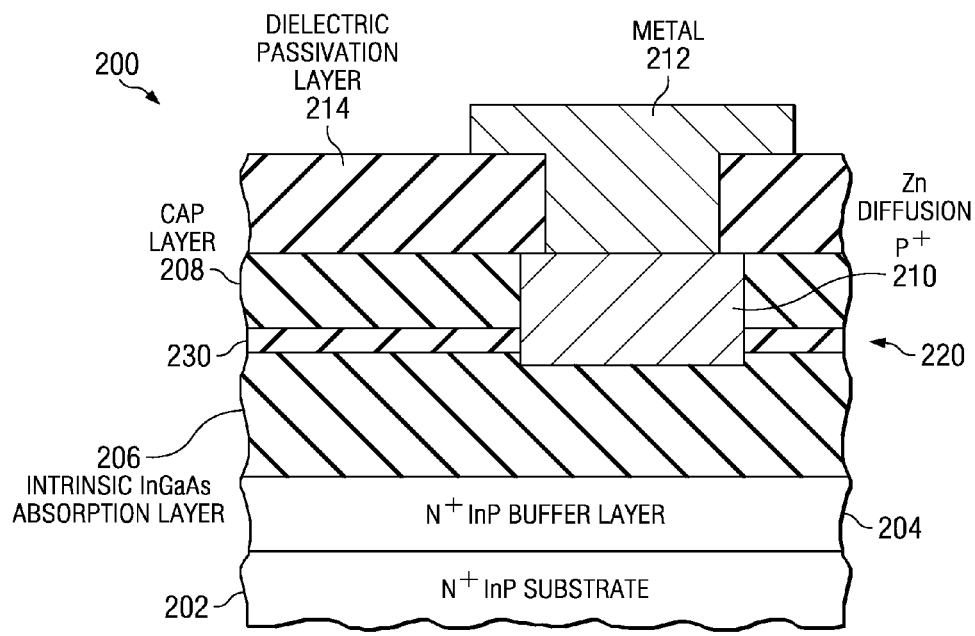
FIG. 2 is an illustration of a photodetector in accordance with an advantageous embodiment of the disclosure.

FIG. 2 is an illustration of a photodetector in accordance with an advantageous embodiment of the disclosure. More particularly, FIG. 2 illustrates a PIN photodetector 200 that provides a significantly reduced depletion width at the interface 220 between intrinsic InGaAs absorption layer 206 and cap layer 208 of PIN photodetector 200 so as to significantly reduce dark current in PIN photodetector 200 relative to PIN photodetector 100 illustrated in FIG. 1.

PIN photodetector 200 may be fabricated in the following manner. Similar to PIN photodetector 100 illustrated in FIG. 1, PIN photodetector 200 may also include N+ InP substrate 202, and N+ InP buffer layer 204 which may be formed of the same materials and in the same manner as substrate 102 and buffer layer 104 in PIN photodetector 100. Intrinsic InGaAs absorption layer 206 may also be formed in the same manner as intrinsic InGaAs absorption layer 106 in photodetector 100. Specifically, absorption layer 206 may be an unintentionally-doped $In_{0.53}Ga_{0.47}As$ semiconductor layer grown on top of buffer layer 204 to a thickness of about 3.5 µm.

PIN photodetector 200 differs from PIN photodetector 100 in that following forming of intrinsic InGaAs absorption layer 206, the topmost region of absorption layer 206 may then be doped to between about $1 \times 10^{17}/cm^3$-$5 \times 10^{17}/cm^3$ N-type using either sulfur or silicon as the dopant species. This topmost region, which may be less than about 1000 Å thick, defines an interface layer or region 230 between absorption layer 206 and cap layer 208 as illustrated in FIG. 2. Interface layer 230 functions to decrease the depletion width and generation current volume at the interface 220 between absorption layer 206 and cap layer 208, and results in a significant reduction in dark current in PIN photodetector 200.

After interface layer 230 is formed, cap layer 208 may then be grown over the interface layer. Cap layer 208 may be an InP layer grown to a thickness of about 0.5-1.0 µm, and may be doped to between about $1 \times 10^{17}$-$5 \times 10^{17}/cm^3$ using either sulfur or silicon as the dopant species. Cap layer 208 is used to provide a wide bandgap semiconductor over narrow bandgap absorption layer 206 in order to reduce surface generation current. Although not illustrated in FIG. 2, an optional contact layer of heavily doped $In_{0.53}Ga_{0.47}As$ may then be grown over cap layer 208 if desired, to provide a low electrical resistance to a subsequently applied metal layer. A dielectric passivation layer 214, similar to dielectric passivation layer 114 in PIN photodetector 100 illustrated in FIG. 1, may then be deposited over cap layer 208 or over the contact layer if the contact layer is provided.

P+ Zn diffusion region 210 may then be formed within the cap layer 208, the N-doped interface layer 230 and a portion of the absorption layer 206 (for example, to a depth of about 1000 Å-1500 Å into absorption layer 206). Diffusion region 210 may be similar to and grown in a similar manner as described with respect to diffusion region 110 in photodetector 100 illustrated in FIG. 1. Metal contacts 212 may be formed on and coupled to P+ Zn diffusion region 210 and may be formed in the same manner as described above with respect to metal contacts 112 in photodetector 100 illustrated in FIG. 1.

Figure 3:
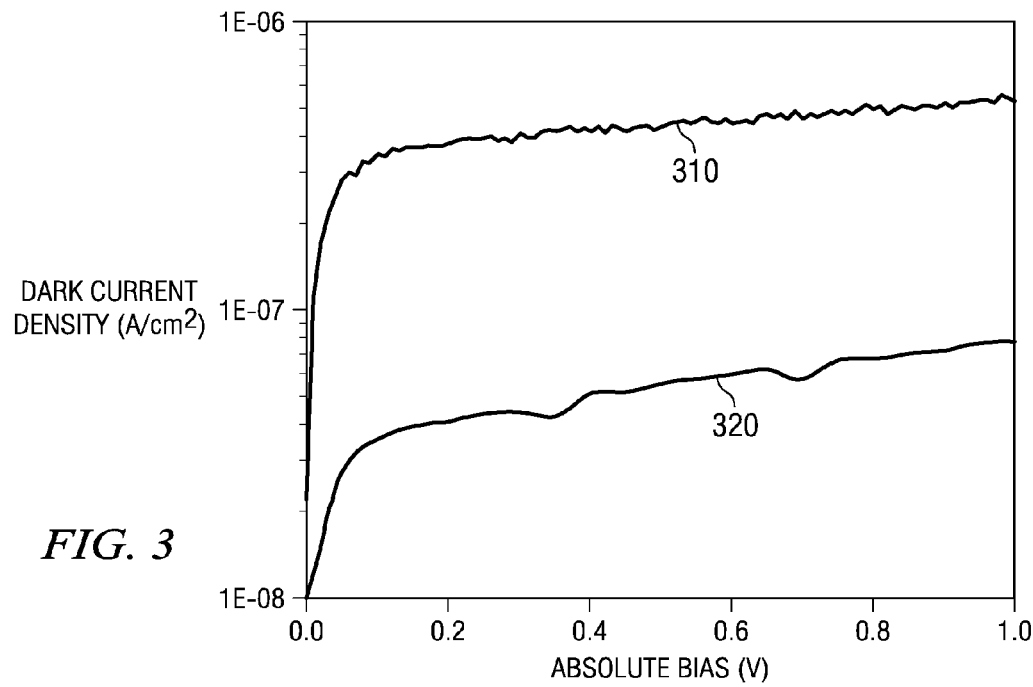
FIG. 3 is a graph that illustrates dark current density versus absolute bias for the photodetectors illustrated in FIGS. 1 and 2.

FIG. 3 is a graph that illustrates dark current density versus absolute bias for the photodetectors illustrated in FIGS. 1 and 2. In particular, trace 310 illustrates dark current density ($A/cm^2$) versus absolute bias (V) for a PIN photodetector such as PIN photodetector 100 shown in FIG. 1, and trace 320 illustrates dark current density ($A/cm^2$) versus absolute bias (V) for a PIN photodetector such as PIN photodetector 200 shown in FIG. 2 having interface layer 230 formed between absorption layer 206 and cap layer 208. Both measurements were made at room temperature. As is clearly shown in FIG. 3, dark current is significantly less in photodetector 200 as compared to photodetector 100.

In general, interfaces between various semiconductor material layers are typically the greatest source of generation current due to localized defects that either induce generation currents or shunt leakage paths to ground points. By choosing appropriate doping levels and thicknesses, it has been found that these sources of dark current can be suppressed without degrading other photodetector figures of merit such as responsivity or capacitance both of which must be maintained if the signal-to-noise ratio is to be improved.

A PIN photodetector designed as illustrated in FIG. 2 has demonstrated a reduction in dark current density by a factor of about nine or a reduction in overall noise by a factor of about three (as compared to a photodetector such as photodetector 100 in FIG. 1) with no decrease in responsivity and with no significant increase in capacitance.

Figure 4:
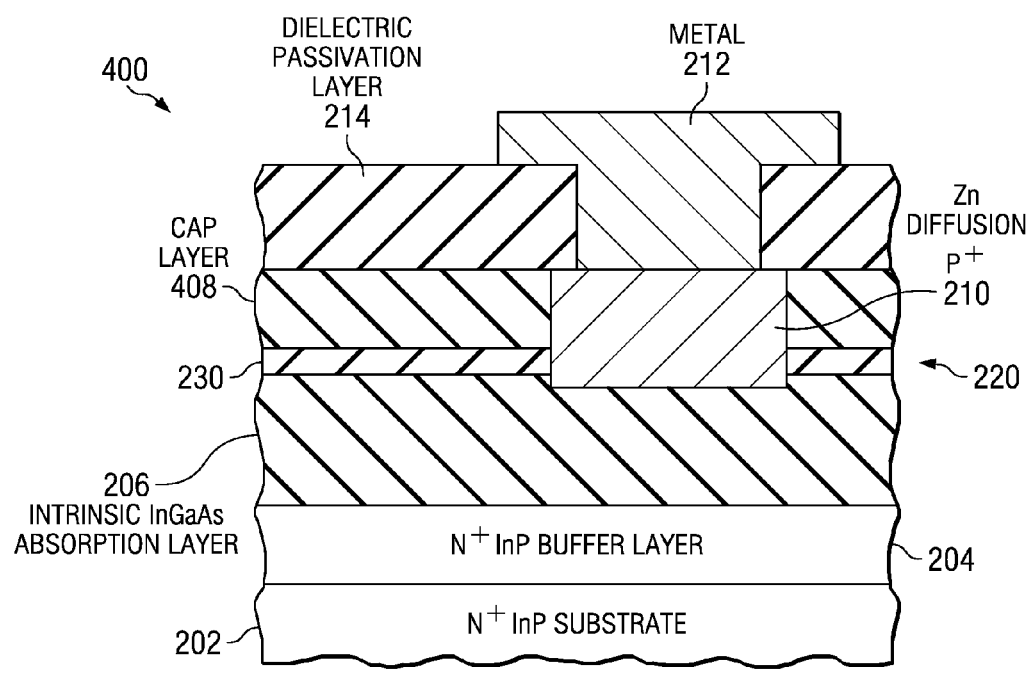
FIG. 4 is an illustration of a photodetector in accordance with a further advantageous embodiment of the disclosure.

FIG. 4 is an illustration of a photodetector in accordance with a further advantageous embodiment of the disclosure. More particularly, FIG. 4 illustrates a PIN photodetector 400 that is generally similar to PIN photodetector 200 illustrated in FIG. 2, and uses similar reference numbers to identify similar components. PIN photodetector 400 differs from PIN photodetector 200 in that cap layer 408 in PIN photodetector 400 comprises a bandgap-graded cap layer. More particularly, after forming interface layer 230 as described with reference to FIG. 2, an InGaAsP cap layer of about 0.5-1.0 µm may then be grown over the interface layer. The InGaAsP cap layer alloy composition is typically chosen to provide a layer that is lattice matched to InP. This cap layer is doped to about $1 \times 10^{17}/cm^3$-$5 \times 10^{17}/cm^3$ using either sulfur or silicon as the dopant species.

In this advantageous embodiment illustrated in FIG. 4, the bandgap-graded cap layer 408 provides a wide bandgap semiconductor over the narrow bandgap $In_{0.53}Ga_{0.47}As$ absorption layer in order to reduce surface generation current. By tailoring the composition of the quaternary InGaAsP cap layer, phosphorus replacement of arsenic atoms at the interface with the absorption layer can be minimized. Replacement of arsenic with phosphorus is the principal source of defects at interface 120 in PIN photodetector 100 illustrated in FIG. 1.

Figure 5:
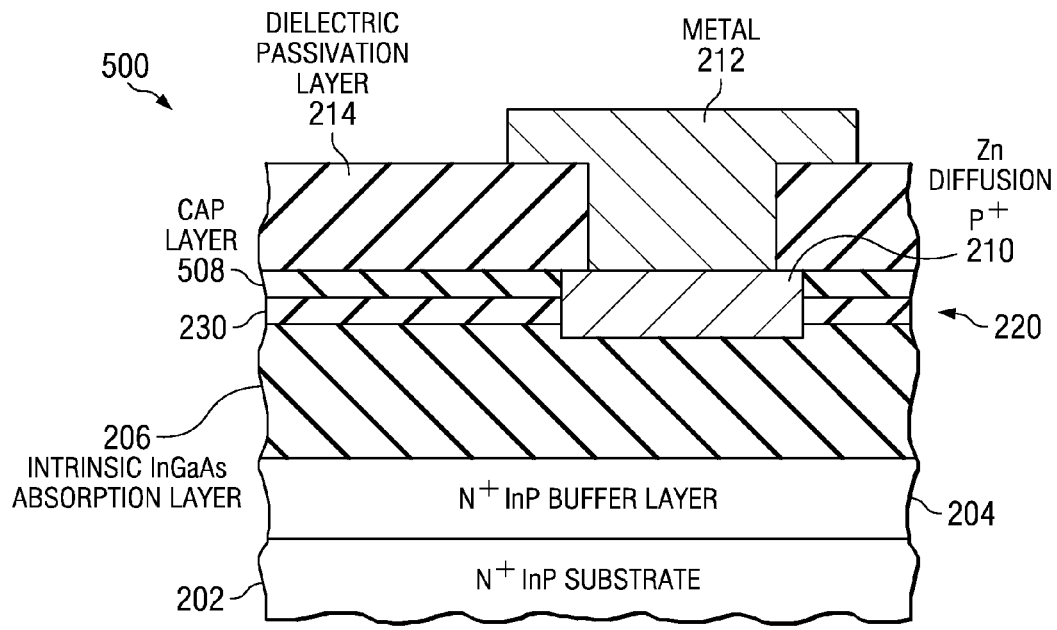
FIG. 5 is an illustration of a photodetector in accordance with a further advantageous embodiment of the disclosure.

FIG. 5 is an illustration of a photodetector in accordance with a further advantageous embodiment of the disclosure. More particularly, FIG. 5 illustrates a PIN photodetector 500 that is generally similar to PIN photodetector 200 illustrated in FIG. 2, and uses similar reference numbers to identify similar components. PIN photodetector 500 differs from PIN photodetector 200 in that it has a thinner cap layer 508, i.e. about 0.01-0.05 µm as compared to a thickness of about 0.5-1.0 µm of cap layer 208 in PIN photodetector 200.

More particularly, cap layer 508 may comprise an InP or InGaAsP cap layer grown over interface layer 230 to a thickness of about 0.01-0.05 µm. This layer may be doped to about $1 \times 10^{17}/cm^3$-$5 \times 10^{17}/cm^3$ using either sulfur or silicon as the dopant species. In this advantageous embodiment the thin cap layer provides a wide bandgap semiconductor over the narrow bandgap absorption layer to reduce surface generation current. By reducing the time at elevated temperature, phosphorus replacement of arsenic atoms at the interface with the $In_{0.53}Ga_{0.47}As$ absorption layer can be minimized.

Figure 6:
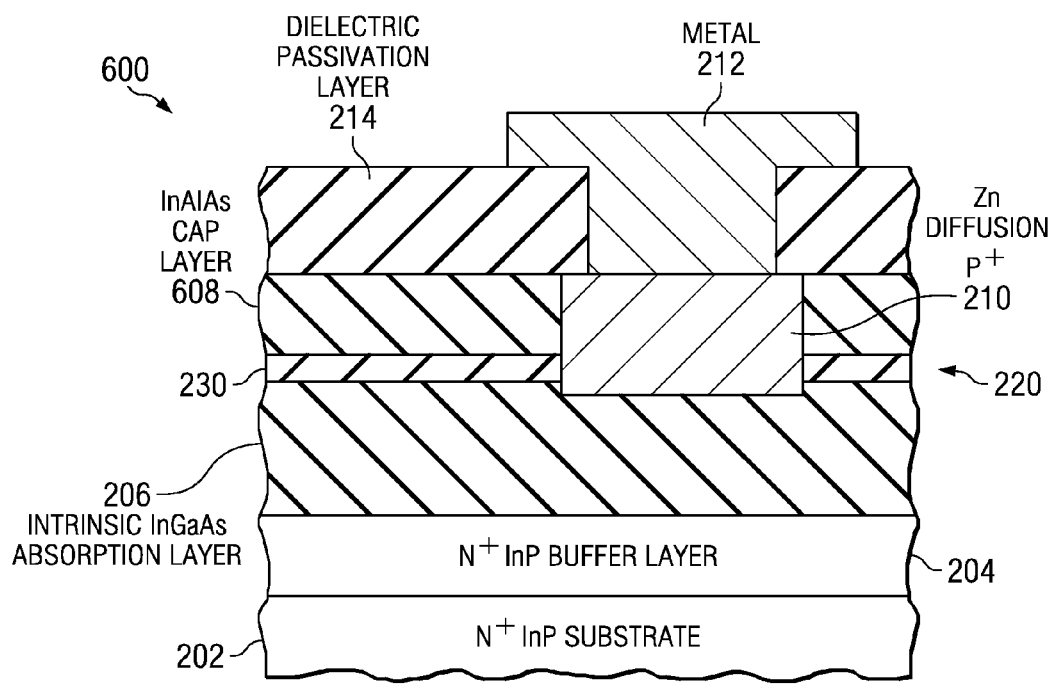
FIG. 6 is an illustration of a photodetector in accordance with a further advantageous embodiment of the disclosure.

FIG. 6 is an illustration of a photodetector in accordance with a further advantageous embodiment of the disclosure. More particularly, FIG. 6 illustrates a PIN photodetector 600 that is generally similar to PIN photodetector 200 illustrated in FIG. 2, and uses similar reference numbers to identify similar components. PIN photodetector 600 differs from PIN photodetector 200 in that it includes a wide bandgap cap layer 608.

In particular, after forming interface layer 230 as described with reference to FIG. 2, an InAlAs cap layer of about 0.5-1.0 µm thick may then be grown over the interface layer. This cap layer may be doped to about $1 \times 10^{17}/cm^3$-$5 \times 10^{17}/cm^3$ using either sulfur or silicon as the dopant species. In this advantageous embodiment, the InAlAs cap layer is used to provide a wide bandgap semiconductor over the narrow bandgap absorption layer to reduce surface generation current. The InAlAs cap layer alloy composition is typically chosen to provide a layer that is lattice matched to InP.

The wider bandgap InAlAs cap layer may provide at least two important advantages over an InP cap layer. First, there is no issue of intermixing of phosphorous at the interface between the absorption layer and cap layer. Also, it provides a wider bandgap semiconductor (1.49 eV versus 1.35 eV for InP). As a result, it has better passivation properties. A quaternary layer InGaAlAs can also be used for cap layer 608. The InGaAlAs cap layer alloy composition is typically chosen to provide a layer that is lattice matched to InP. In general, the choice of the alloy system to be used for cap layer 608 (InAlAs) is intended to be exemplary only as other wide bandgap alloys may also be used, and it is not intended to limit advantageous embodiments to any particular alloy.

Figure 7:
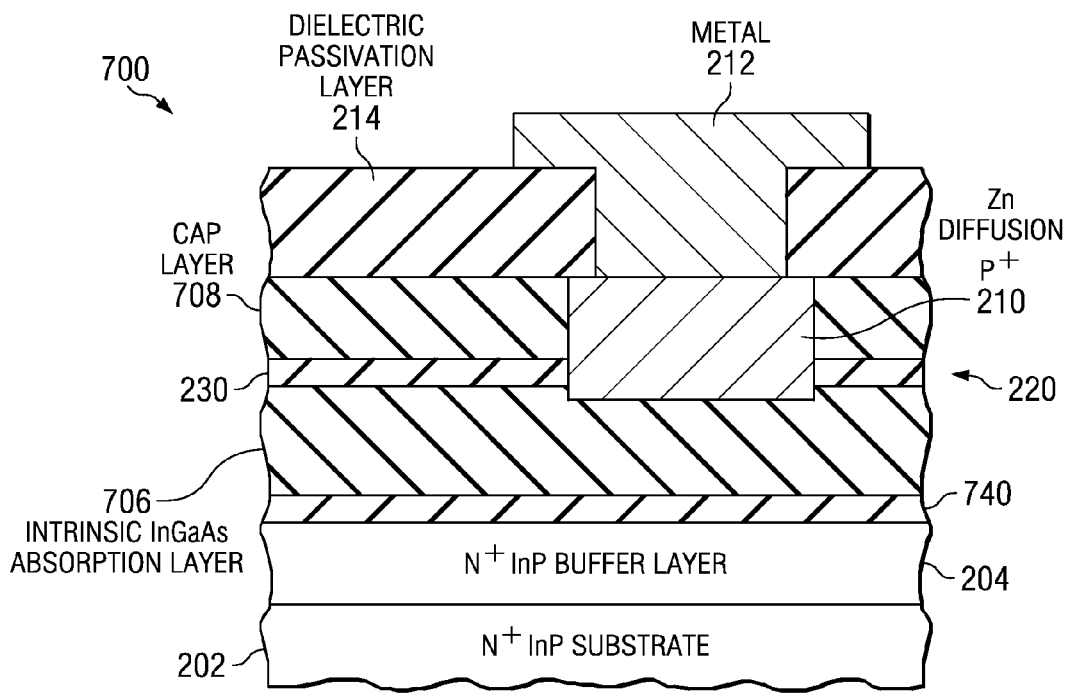
FIG. 7 is an illustration of a photodetector in accordance with a further advantageous embodiment of the disclosure.

FIG. 7 is an illustration of a photodetector in accordance with a further advantageous embodiment of the disclosure. More particularly, FIG. 7 illustrates a PIN photodetector 700 that is generally similar to PIN photodetector 200 illustrated in FIG. 2, and uses similar reference numbers to identify similar components. PIN photodetector 700 differs from PIN photodetector 200 in that a counterdoped interface layer 740 is formed between N⁺ InP buffer layer 204 and intrinsic InGaAs absorption layer 706 of PIN photodetector 700. Counterdoped interface layer 740 enables an internal electric field profile to be created that minimizes dark current from the interface.

More particularly, after forming N⁺ InP buffer layer 204 as described with reference to FIG. 2, an unintentionally-doped $In_{0.53}Ga_{0.47}As$ semiconductor layer of about 3.5 µm thickness may then be grown on top of the InP buffer layer to form intrinsic absorption layer 706. The bottommost region of absorption layer 706 may be doped, typically with sulfur, which diffuses out of the InP substrate during epitaxy growth of subsequent layers to form counterdoped interface layer 740. The sulfur profile results in a built-in electric field that reduces diffusion dark current.

In this advantageous embodiment, the sulfur profile is intentionally counter-doped with a P-type dopant, preferably carbon, to tailor the resultant carrier profile to further reduce dark current.

After forming absorption layer 706, interface layer 230 is formed as described with reference to FIG. 2, and a cap layer 708 is then formed on the interface layer 230. Cap layer 708 may be formed of InP, InGaAsP or InAlAs or other wide bandgap semiconductor material as described previously.

Figure 8:
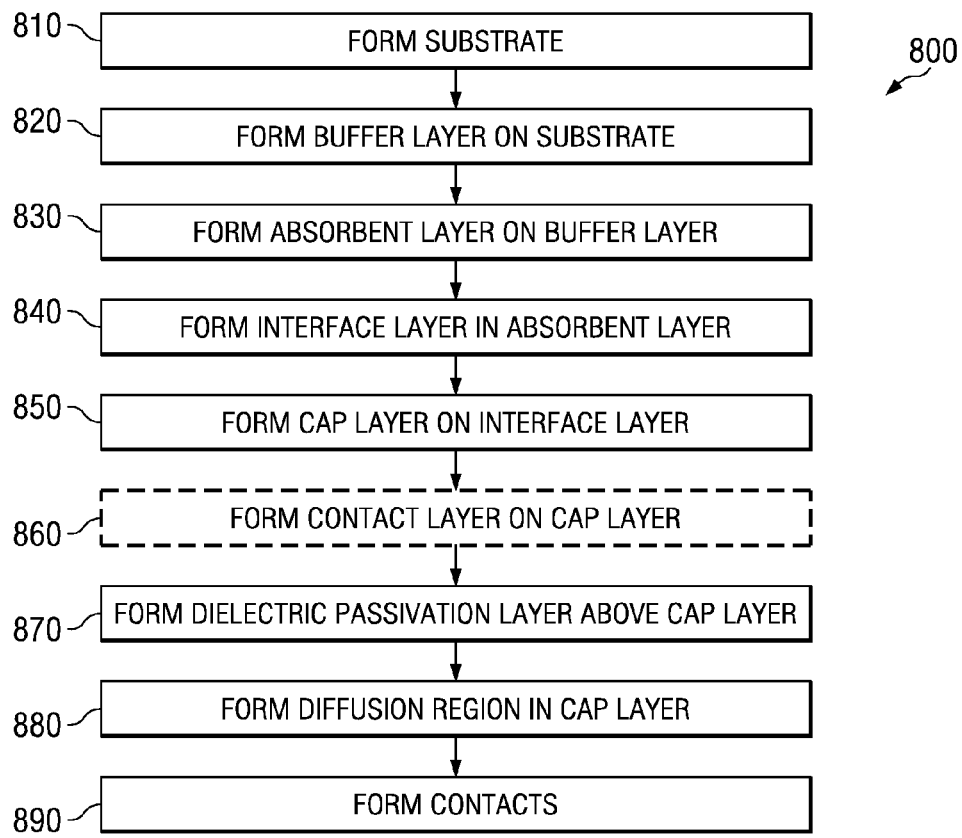
FIG. 8 is a flowchart that illustrates a method for fabricating a photodetector in accordance with an advantageous embodiment of the disclosure.

FIG. 8 is a flowchart that illustrates a method for fabricating a photodetector in accordance with an advantageous embodiment of the disclosure. The method is generally designated by reference number 800, and begins by forming a substrate (Step 810) and forming a buffer layer on the substrate (Step 820). Steps 810 and 820 may be implemented by forming an N⁺ InP substrate, typically doped with sulfur between $0.5 \times 10^{18}$-$5 \times 10^{18}$/cm$^3$, and by forming a buffer layer that also comprises an N$^+$ InP layer and that is of about the same doping concentration as the substrate. The buffer layer may be grown to a thickness of about 0.5-1.0 µm. Either sulfur or silicon may be used as the dopant species. A Metal-Organic Vapor Phase Epitaxy (MOVPE) reactor or a Molecular Beam Epitaxy (MBE) reactor may be used to grow the buffer layer and all subsequent semiconductor layers.

An absorber layer may then be formed on the buffer layer (Step 830). The absorber layer may be an intrinsic InGaAs absorbent layer designed and grown as described with reference to any of FIGS. 2 and 4-7.

An interface layer may then be formed in the absorbent layer (Step 840). The interface layer may, for example, be formed as interface layer 230 as described with reference to FIGS. 2 and 4-7.

A cap layer may then be formed on the interface layer (Step 850). The cap layer may, for example, be formed as one of cap layers 208, 408 508, 608 and 708 described with reference to FIGS. 2 and 4-7.

A contact layer may then be optionally formed on the interface layer, if desired (Step 860) as described, for example, with reference to FIG. 2.

A dielectric passivation layer may then be formed above the cap layer, i.e., either on the cap layer or on the contact layer if a contact layer is provided, (Step 870). The dielectric passivation layer may, for example, be formed as dielectric passivation layer 214 in FIGS. 2 and 4-7.

A diffusion region may then be formed in the cap layer, the interface layer and in at least a portion of the absorption layer (Step 880), and contacts may be formed on and coupled to the diffusion layer (Step 890). The diffusion region and contacts may, for example, be formed as diffusion region 210 and contacts 212 in FIGS. 2 and 4-7.

PIN photodetectors according to advantageous embodiments of the disclosure can be effectively used in numerous applications. For example, advantageous embodiments can provide very sensitive photodetector arrays for night vision cameras that are capable of operating at room temperature without thermo-electric cooling. The photodetectors can be of great utility when used by soldiers or other individuals having limited stored electrical power. PIN photodetectors according to advantageous embodiments can also be used for astronomical imaging where very high sensitivity photodetectors are desirable.

The description of advantageous embodiments has been presented for purposes of illustration and description, and is not intended to be exhaustive or limited to the form disclosed. Many modifications and variations will be apparent to those of ordinary skill in the art. Further, different advantageous embodiments may provide different advantages as compared to other advantageous embodiments. The embodiments selected were chosen and described in order to best explain features and practical applications, and to enable others of ordinary skill in the art to understand various embodiments with various modifications as are suited to particular uses contemplated.

What is claimed is:

1. A photodetector, comprising:
   a substrate;
   a buffer layer formed on the substrate;
   an absorption layer formed on the buffer layer for receiving incident photons and generating charged carriers;
   an N-doped interface layer formed on the absorption layer, wherein the N-doped interface layer comprises a doped region of the absorption layer;
   a dielectric cap layer formed on the N-doped interface layer;
   a dielectric passivation layer formed above the dielectric cap layer;
   a p$^+$ diffusion region formed within the dielectric cap layer, the N-doped interface layer and at least a portion of the absorption layer; and
   at least one contact formed on and coupled to the p$^+$ diffusion region.

2. The photodetector of claim 1, wherein the substrate comprises an N$^+$ InP substrate, and wherein the buffer layer comprises an N$^+$ InP buffer layer.

3. The photodetector of claim 1, wherein the absorption layer comprises an unintentionally doped InGaAs absorption layer.

4. The photodetector of claim 1, wherein the N-doped interface layer comprises a region of the absorption layer doped to between about $1 \times 10^{17}$/cm$^3$-$5 \times 10^{17}$/cm$^3$.

5. The photodetector of claim 1, wherein the N-doped interface layer has a thickness of less than about 1000 Å.

6. The photodetector of claim 1, wherein the cap layer comprises an InP cap layer.

7. The photodetector of claim 1, wherein the P$^+$ diffusion region comprises a P$^+$ Zn diffusion region.

8. The photodetector of claim 1, wherein the cap layer comprises a doped InGaAsP cap layer.

9. The photodetector of claim 1, wherein the cap layer comprises one of an InP cap layer or an InGaAsP cap layer and has a thickness of about 0.01-0.05 µm.

10. The photodetector of claim 1, wherein the cap layer comprises an InAlAs cap layer.

11. The photodetector of claim 1, and further comprising:
    a counterdoped interface layer formed between the buffer layer and the absorption layer for creating an internal electric field profile.

12. A method for fabricating a photodetector, comprising:
    forming a substrate;
    forming a buffer layer on the substrate;
    forming an absorption layer on the buffer layer for receiving incident photons and generating charged carriers;
    forming an N-doped interface layer on the absorption layer, wherein the N-doped interface layer comprises an N-doped region in the absorption layer;
    forming a dielectric cap layer on the N-doped interface layer;
    forming a dielectric passivation layer above the dielectric cap layer;
    forming a p$^+$ diffusion region within the dielectric cap layer, the N-doped interface layer and at least a portion of the absorption layer; and
    forming and coupling at least one contact on the p$^+$ diffusion region.

13. The method of claim 12, wherein forming an N-doped interface layer on the absorption layer further comprises:
    forming an N-doped region in the absorption layer having a thickness of less than about 1000 Å.

14. The method of claim 13, wherein the N-doped region in the absorption layer is doped to between about $1 \times 10^{17}$/cm$^3$-$5 \times 10^{17}$/cm$^3$.

15. The method of claim 12, wherein forming a dielectric cap layer on the N-doped interface layer, comprises:
    forming a doped InGaAsP cap layer on the N-doped interface layer.

16. The method of claim 14, wherein forming a dielectric cap layer on the N-doped interface layer, comprises:

forming one of an InP cap layer or an InGaAsP cap layer having a thickness of about 0.01-0.05 µm on the N-doped interface layer.

17. The method of claim 14, wherein forming a dielectric cap layer on the N-doped interface layer, comprises:
forming an InAlAs cap layer on the N-doped interface layer.

18. The method of claim 12, and further comprising:
forming a counterdoped interface layer between the buffer layer and the absorption layer for creating an internal electric field profile.

19. A PIN photodetector, comprising:
an $N^+$ InP substrate;
an $N^+$ InP buffer layer formed on the $N^+$ InP substrate;
an intrinsic InGaAs absorption layer formed on the $N^+$ InP buffer layer for receiving incident photons and generating charged carriers;
an N-doped interface layer formed on the absorption layer, wherein the N-doped interface layer comprises a doped region of the absorption layer;
a dielectric cap layer formed on the N-doped interface layer, wherein the N-doped interface layer reduces depletion width at an interface between the intrinsic InGaAs absorption layer and the dielectric cap layer;
a dielectric passivation layer formed above the dielectric cap layer;
a $P^+$ Zn diffusion region formed within the dielectric cap layer, the N-doped interface layer and at least a portion of the absorption layer; and
at least one metal contact formed on and coupled to the $P^+$ Zn diffusion region.

* * * * *